(12) United States Patent
Breitwisch et al.

(10) Patent No.: US 7,981,755 B2
(45) Date of Patent: Jul. 19, 2011

(54) SELF ALIGNED RING ELECTRODES

(75) Inventors: Matthew J. Breitwisch, Yorktown Heights, NY (US); Eric A. Joseph, White Plains, NY (US); Chung H. Lam, Peekskill, NY (US); Alejandro G. Schrott, New York, NY (US); Brandon Yee, Westbury, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/924,073

(22) Filed: Oct. 25, 2007

(65) Prior Publication Data

US 2009/0111228 A1   Apr. 30, 2009

(51) Int. Cl.
*H01L 21/331* (2006.01)
*H01L 21/44* (2006.01)
(52) U.S. Cl. .. 438/361; 438/680; 438/689; 257/E45.001
(58) Field of Classification Search .................. 257/363, 257/1–8, E45.001–E45.006; 438/238, 261, 438/382–385, 361, 362, 363, 364, 365, 680, 438/689
See application file for complete search history.

(56) References Cited

U.S. PATENT DOCUMENTS

| | | | | |
|---|---|---|---|---|
| 5,449,934 | A  * | 9/1995 | Shono et al. | 257/295 |
| 7,101,807 | B2 * | 9/2006 | Ishikawa | 438/740 |
| 7,196,346 | B2 * | 3/2007 | Okuno | 257/5 |
| 2002/0072223 | A1 * | 6/2002 | Gilbert et al. | 438/629 |
| 2002/0160551 | A1 | 10/2002 | Harshfield | |
| 2005/0194620 | A1 * | 9/2005 | Dennison et al. | 257/246 |
| 2006/0175597 | A1 * | 8/2006 | Happ | 257/2 |
| 2006/0284214 | A1 * | 12/2006 | Chen | 257/213 |
| 2007/0097737 | A1 * | 5/2007 | Asano et al. | 365/163 |
| 2007/0097738 | A1 * | 5/2007 | Asano et al. | 365/163 |
| 2007/0114510 | A1 * | 5/2007 | Sato et al. | 257/5 |
| 2007/0262388 | A1 * | 11/2007 | Ho et al. | 257/363 |
| 2007/0278529 | A1 * | 12/2007 | Lai et al. | 257/209 |
| 2008/0237565 | A1 * | 10/2008 | Chang | 257/4 |

* cited by examiner

*Primary Examiner* — David S Blum
(74) *Attorney, Agent, or Firm* — Scully, Scott, Murphy & Presser, P.C.; Vazken Alexanian

(57) ABSTRACT

The present invention in one embodiment provides a method of manufacturing an electrode that includes providing at least one metal stud positioned in a via extending into a first dielectric layer, wherein an electrically conductive liner is positioned between at least a sidewall of the via and the at least one metal stud; recessing an upper surface of the at least one metal stud below an upper surface of the first dielectric layer to provide at least one recessed metal stud; and forming a second dielectric atop the at least one recessed metal stud, wherein an upper surface of the electrically conductive liner is exposed.

10 Claims, 4 Drawing Sheets

SELF ALIGNED RING ELECTRODES

FIELD OF THE INVENTION

In one embodiment, the present invention relates to electrode contacts to electrical devices. In another embodiment, the present invention relates to memory devices.

BACKGROUND OF THE INVENTION

In semiconductor and memory device applications, an electrode is a conductor through which electric current is passed. An electrode may be composed of a metal, such as copper, tungsten, silver, lead, or zinc. An electrode may also be in the form of a nonmetallic conductor, including a semiconducting material, such as doped polysilicon.

Phase change memory (PCM) devices store data using a phase change material, such as, for example, a chalcogenide alloy, that transforms into a crystalline state or an amorphous state. An electrode may provide a current through the PCM device to produce heat that effectuates phase changes in the PCM between the crystalline and the amorphous phases. Each state of the phase change material has different resistance characteristics. Specifically, the phase change material in the crystalline state has low resistance and the phase change material in the amorphous state has high resistance. The crystalline state is typically referred to as a "set state" having a logic level "0", and the amorphous state is typically referred to as a "reset state" having a logic level "1".

SUMMARY OF THE INVENTION

The present invention, in one aspect provides a method of forming a ring electrode. In one embodiment, the inventive method comprises:

providing at least one metal stud positioned in a via extending into a first dielectric layer, wherein an electrically conductive liner is positioned between at least a sidewall of the via and the metal stud;

recessing an upper surface of the at least one metal stud below an upper surface of the first dielectric layer to provide at least one recessed metal stud; and forming a second dielectric layer atop the at least one recessed metal stud, wherein an upper surface of the electrically conductive liner is exposed.

In one embodiment of the inventive method of forming an electrode, the step of recessing the upper surface of the at least one metal stud includes an etch of the at least one metal stud selective to the electrically conductive liner. In one embodiment, the at least one metal stud is composed of W and the electrically conductive liner is composed of TiN. In a further embodiment, recessing the upper surface of the at least one metal stud includes an anisotropic etch process. In one embodiment, the anisotropic etch step is a reactive ion etch composed of a sulfur hexafluoride/oxygen inductively coupled plasma having a density greater than about $10^{10}$ $cm^{-3}$. In one embodiment, the second dielectric layer that is deposited atop the upper surface of the at least one recessed metal stud may be an insulating material, such as an oxide, nitride or oxynitride. In one embodiment, the step of forming of the second dielectric layer atop the at least one recessed metal stud includes depositing the second dielectric layer atop the upper surface of the first dielectric layer, the upper surface of the electrically conductive liner and the at least one recessed metal stud; and then planarizing the structure until the upper surface of the electrically conductive liner is exposed. The exposed upper surface of the electrically conductive liner provides the electrical contact surface of the electrode to the overlying electronic devices. In a further embodiment, the perimeter of the exposed upper surface of the electrically conductive liner represents a ring geometry when viewed from a top view.

Another aspect of the present invention is a method for forming a memory device, wherein the surface area of the electrical contact to the memory device is reduced by utilizing the above described electrode. In one embodiment, this method includes the steps of:

providing at least one metal stud positioned in a via extending into a first dielectric layer, wherein an electrically conductive liner is positioned between at least a sidewall of the via and the at least one metal stud;

etching the at least one metal stud selective to the electrically conductive liner to provide at least one recessed metal stud;

forming a second dielectric layer atop the at least one recessed metal stud, wherein an upper surface of the electrically conductive liner is exposed; and forming a phase change memory cell in contact with the upper surface of the electrically conductive liner.

In an embodiment of the method of forming a memory device, the step of forming the phase change memory cell includes forming a third dielectric layer atop the second dielectric layer, the first dielectric layer and the upper surface of the electrically conductive liner; forming an opening in the third dielectric layer, wherein the center of the opening is offset from the center of the via to expose only a portion of the upper surface of the electrically conductive liner; and depositing a phase change material in the opening.

In one embodiment, the phase change material comprises Ge, Sb, Te or a combination thereof. In one embodiment, the phase change memory cell further includes a layer of a barrier metal, such as TiN or TaN, deposited atop the phase change material.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
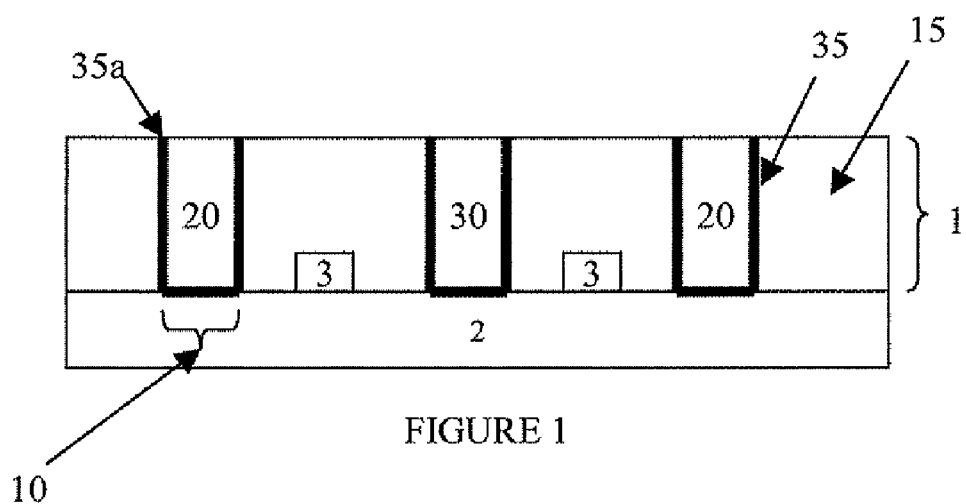
FIG. 1 is a side cross sectional view of an initial structure including a first dielectric layer and conductive regions, such as a metal stud, extending through the first dielectric layer, as used in accordance with one embodiment of the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods for forming electrodes and memory devices. When describing the methods, the following terms have the following meanings, unless otherwise indicated.

As used herein, the term "memory device" means a structure in which the electrical state of which can be altered and then retained in the altered state; in this way a bit of information can be stored.

"Volatile memory" means memory in which stored information is lost when power to the memory cell is turned off.

"Non-volatile memory" means memory in which information stored is maintained after the power supply is turned off.

As used herein, an "anisotropic etch process" denotes a material removal process in which the etch rate in the direction normal to the surface to be etched is greater than in the direction parallel to the surface to be etched.

As used herein, "insulating" denotes a material having a room temperature conductivity of less than about $10^{-10}(\Omega\text{-m})^{-1}$.

"Electrically conductive" and/or "electrically communicating" as used through the present disclosure means a material typically having a room temperature conductivity of greater than $10^{-8}(\Omega\text{-m})^{-1}$.

The term "electrical contact" denotes direct physical contact between two materials, wherein the interface between the two materials is electrically conductive As used herein, a "via" refers to a hole formed in a dielectric which is then filled with metal to provide vertical connection between stacked up interconnect metal lines and/or devices.

As used herein, a "metal stud" refers to the metal formed within a via.

As used herein, a "metal" is an electrically conductive material, wherein in metal atoms are held together by the force of a metallic bond; and the energy band structure of metal's conduction and valence bands overlap, and hence, there is no energy gap.

As used herein, a "phase change material" denotes a material that converts from an amorphous phase to a crystalline phase or vice versa upon the application of energy.

As used herein, a "barrier metal" is a material used to chemically isolate the phase change material from metals and provides an electrical contact between them.

As used herein, a "dielectric" is a non-metallic solid displaying insulating properties, having a filled valance band at 0K, and a band gap on the order of approximately 5 eV.

"Reactive Ion Etching" is a form of plasma etching that during etching the surface to be etched is placed on the RF powered electrode, wherein the surface to be etched takes on a potential that accelerates the etching species extracted from a plasma toward the surface, to be etched in which the chemical etching reaction is taking place in the direction normal to the surface.

"Chemical Vapor Deposition" is a deposition process in which a deposited species is formed as a results of chemical reaction between gaseous reactants at greater than room temperature (25° C. to 600° C.); wherein solid product of the reaction is deposited on the surface on which a film, coating, or layer of the solid product is to be formed.

As used herein, "Planarization" is a material removal process that employs at least mechanical forces, such as frictional media, to produce a planar surface.

"Chemical Mechanical Planarization" is a material removal process using both chemical reactions and mechanical forces to remove material and planarize a surface.

As used herein, the term "resistive memory device" denotes a device whose effective electrical resistivity can be switched between two or more resistivity states upon an application of an energy pulse, such as a voltage or current pulse. Pulse time may range from approximately 5 nano-seconds to approximately $5\times10^5$ nano-seconds.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

FIGS. 1 to 10 depict embodiments of the present method for forming an electrode that may be utilized to provide electrical contact to a memory cell. The electrode is self-aligned to a metal stud, because the electrode is formed from the barrier metal liner that is positioned between the metal stud and the sidewall of the via, in which the metal stud is formed therefore, the production of the electrode does not require the formation of an additional photomask or hardmask than a process flow to provide a metal stud and barrier metal positioned in a via.

FIG. 1 depicts one embodiment of an interconnect level 1 atop a substrate 2, such as a semiconducting wafer. In one embodiment, the present method may begin following front end of the line (FEOL) processing, in which a device interconnect level 1 is provided that includes a first dielectric layer 15 having a plurality of openings 10 that are filled with at least one conductive material, such as a metal stud 20 or bar 30. In one embodiment, the first dielectric layer 15 may include a metal stud 20 that provides electrical conductivity to a first terminal (source/drain) of a select/access transistor (not shown) that is formed in the underlying substrate 2. In one embodiment, the first dielectric layer 15 may also include at least one metal bar 30, wherein the metal bar 30 is a conducting line that may be used to provide electrical conductivity to the second terminal (source/drain) of a select/access transistor positioned in the underlying substrate 2. In one embodiment, the first dielectric layer 15 may farther include a lower conductive line 3. The lower conductive line 3 may be a word line, which may bias the gate of the select/access transistor that links the metal stud 20 with the metal bar 30.

The substrate 2 may include any number of active and/or passive devices (or regions) located within the substrate 2 or on a surface thereof. For clarity, the active and/or passive devices (or regions) are not shown in the drawings, but are nevertheless meant to be included with substrate 2. For example, the substrate 2 may comprise any semiconductor material including, but not limited to: Si, Ge, SiGe, SiC, SiGeC, InAs, GaAs, InP and other III/V compound semiconductors. The substrate 2 may be undoped, or doped. In one example, the doping of a Si-containing substrate may be light (having a dopant concentration of less than 1E17 atoms/cm$^3$) or heavy (having a dopant concentration of about 1E17 atoms/cm$^3$ or greater). The substrate 2 can have any crystallographic orientation such as (100), (110) or (111). Hybrid substrates having at least two planar surfaces of different crystallographic orientation are also contemplated.

In one embodiment, the device interconnect level 1 is formed atop the substrate 2 using deposition, etching and planarization. More specifically, in one embodiment of the invention, a first dielectric layer 15 is formed atop the substrate 2 by a deposition process including, for example, chemical vapor deposition (CVD), plasma-assisted CVD, evaporation, spin-on coating, or chemical solution deposition. The first dielectric layer 15 includes any suitable insulating material that is typically employed in interconnects to electrical devices. This includes inorganic dielectrics, organic dielectrics and combinations thereof, including, multilayers thereof Illustrative examples of suitable materials for first dielectric layer 15 include, but are not limited to: $SiO_2$, Boron Phospho Silicate Glass (BPSG) oxide, fluorinated $SiO_2$, $Si_3N_4$, organic thermoset or thermoplastic dielectrics such as polyimides, polyarylenes, benzocyclobutenes and the like, spun-on glasses including organosilicate glass (OSG), with or without porosity, such as hydrogen silsesquixoane, methyl silsesquixoane, tetraethylorthosilicate (TEOS) and the like, amorphous alloys of Si, O, C and H, or SiCOH, amorphous alloys of Si, O, F and H.

In one embodiment, the first dielectric layer 15 comprises a low-k dielectric having a thickness ranging from about 10 nm to about 1000 nm. In another embodiment, the first dielectric layer 15 has a thickness on the order of about 300 nm. In one embodiment, the dielectric constant of the first dielectric layer 15 may be less than about 3.5. In another embodiment, the first dielectric layer 15 may have a dielectric constant that is from about 1.0 to about 3.0. Low-k dielectrics may include organic dielectrics such as low dielectric constant polymer dielectrics or may include low dielectric constant carbon-doped oxides. One example of a low-k dielectric polymer dielectric is SiLK™. Specifically, SiLK™ is a class of polymer-based low-k dielectric materials comprising a b-staged polymer having a composition including about 95% carbon. An example of a low dielectric constant carbon doped oxide is SiCOH.

After forming the first dielectric layer 15 on a surface of the substrate 2, openings 10 are formed into the first dielectric layer 15 so as to expose portions of the underlying substrate 2, in which device interconnects 20, 30, such as metal studs 20 and/or metal bars 30 are subsequently formed. In one embodiment, the openings 10 are provided with a circular cross section when viewed from the top view. The circular cross section of the openings contributes to the ring geometry of the later formed electrodes. The openings 10, hereafter referred to as vias, are formed utilizing conventional lithography and etching. For example, the lithographic step may include applying a photoresist to the first dielectric layer 15, exposing the photoresist to a pattern of radiation and developing the pattern into the exposed photoresist utilizing a resist developer. The etching step used in providing the vias 10 into first dielectric layer 15 includes chemical reactive ion etching (RIE), plasma etching, ion beam etching or laser ablation. Following etching, the photoresist is typically removed from the structure utilizing a resist stripping process, such as oxygen ashing.

In one embodiment, device interconnects, such as metal studs 20 and metal bars 30, are then formed within the vias 10 in the first dielectric layer 15 using deposition and planarization processes. In one embodiment, an electrically conductive liner 35 is positioned between the device interconnects' via sidewalls, and the upper surface of the underlying substrate 2.

Still referring to FIG. 1, in one embodiment, the electrically conductive liner 35 is deposited atop the horizontal and vertical surfaces of the via 10 within the first dielectric layer 15 including the exposed upper surface of the substrate 2 to provide electrical contacts to the devices positioned therein. In one embodiment, the electrically conductive liner 35 is a barrier metal. In one embodiment, the electrically conductive liner 35 is a substantially conformal layer. The term "conformal layer" denotes a layer having a thickness that does not deviate from greater than or less than 20% of an average value for the thickness of the layer. In one embodiment, the electrically conductive liner 35 may comprise TiN or TaN. In one embodiment, the electrically conductive liner 35 may have a thickness ranging from about 2 nm to about 50 nm. In another embodiment, the electrically conductive liner 35 may have a thickness on the order of about 10 nm. In one embodiment, the electrically conductive liner 35 may be deposited by sputter deposition. In another embodiment, the electrically conductive liner 35 may be deposited by chemical vapor deposition. Variations of CVD processes include, but are not limited to, Atmospheric Pressure CVD (APCVD), Low Pressure CVD (LPCVD), Plasma Enhanced CVD (EPCVD), Metal-Organic CVD (MOCVD) and combinations thereof may also be employed. In one embodiment, the electrically conductive liner 35 prevents the electromigration of a conductive metal into the first dielectric layer 15.

Following the formation of the electrically conductive liner 35, a conductive material, such as Cu or W, is then formed utilizing a conventional deposition process, such as plating or sputtering, filling at least the vias 10. After filling the vias 10 with a conductive material, the structure is typically subjected to a planarization process, such as chemical-mechanical polishing or grinding, to provide a planar structure, as depicted in FIG. 1. Note that each top surface of conductive material, metal studs 20 and/or metal bars 30, is substantially coplanar with the abutting top surface of first dielectric layer 15. Note that the upper surface of the electrically conductive liner 35 is an exposed surface 35a that eventually provides the point of electrical contact between the electrically conductive liner 35 and the latter formed memory cell.

Figure 2:
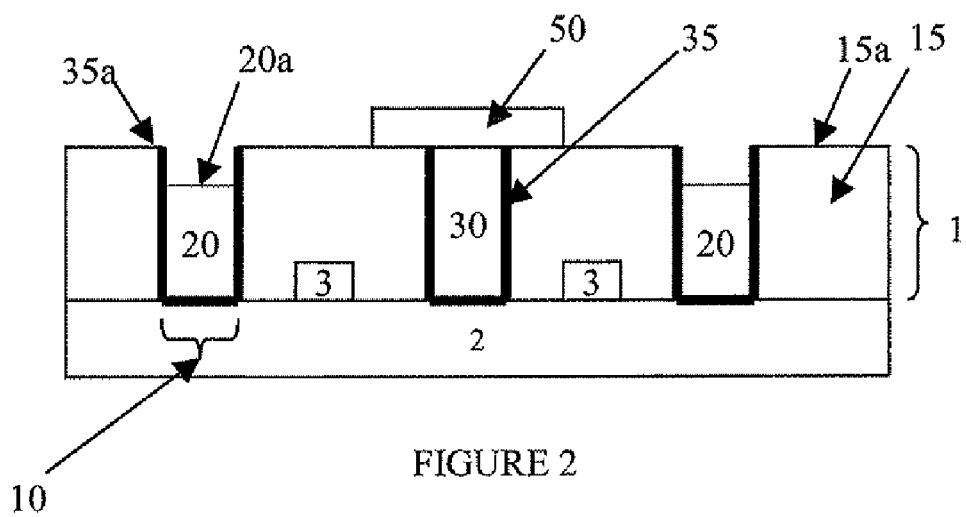
FIG. 2 is a side cross sectional view depicting recessing the upper surface of the metal stud below the upper surface of the first dielectric layer to provide a recessed metal stud, in accordance with one embodiment of the present invention.

FIG. 2 is a side cross sectional view depicting recessing of the upper surface of the metal stud 20 below an upper surface 15a of the first dielectric layer 15 to provide a recessed metal stud 20a, in accordance with one embodiment of the present invention. In one embodiment, a protective photomask 50 is formed over the metal bar 30 prior to etching of the metal studs 20. In one embodiment, the protective photomask 50 is formed by depositing a layer of photoresist atop the substantially planar surface of the first dielectric layer 15, metal studs 20 and metal bar 30, wherein following deposition of the layer of photoresist, the resist is patterned to provide a photomask 50 that protects the metal bar 30.

Following photoresist patterning and development, the exposed portions of the device interconnects, i.e., metal studs 20, are etched using an anisotropic etch process, i.e., reactive ion etching, selective to the electrically conductive liner 35 and the first dielectric layer 15. In one embodiment, the metal studs 20 are composed of tungsten (W) and the electrically conductive liner 35 is composed of TaN or TiN, wherein recessing the upper surface of the metal studs 20 includes reactive ion etch processing with a sulfur hexafluoride/oxygen inductively coupled plasma having a density greater than about $10^{10}$ cm$^{-3}$ and having a flow ratio of about 4:1 sulfur hexafluoride to oxygen. In another embodiment the reactive ion etch chemistry may be $NF_3Cl_2$. An inductively coupled plasma is a high density plasma generated by an axial magnetic field that induces an electric field with circulation in the plane of the wafer and produces a plasma in which its density is decoupled from the ion energy at the substrate/electrode. In one embodiment, the above etch chemistry effectively removes W, while being selective to TiN or TaN. In one embodiment, the upper surface of the W metal studs 20 are recessed from about 10 nm to about 250 nm from the upper surface 15a of the first dielectric layer 15. In another embodiment, the upper surface of the W metal studs 20 are recessed from about 30 nm to about 100 nm from the upper surface 15a of the first dielectric layer 15. In a further embodiment, the upper surface of the W metal studs 20 are recessed from about 20 nm to about 50 nm from the upper surface 15a of the first dielectric layer 15.

In another embodiment, the metal studs 20 are composed of Cu and the electrically conductive liner 35 is TaN or TiN. The Cu is etched selective to the electrically conductive liner 35, which may be composed of TaN or TiN. In one embodiment, the etch chemistry that removes Cu selective to TaN or TiN is an ammonium per sulfide ($(NH_4)_2 S_2O_8$) solution. In one embodiment, the etch chemistry that removes Cu selective to TaN or TiN is a sulfuric acid ($H_2SO_4$) solution. In one embodiment, the upper surface of the Cu metal studs 20 is recessed from about 10 nm to about 250 nm from the upper surface 15a of the first dielectric layer 15. In another embodiment, the upper surface of the Cu metal studs 20 is recessed from about 30 nm to about 100 nm from the upper surface 15a of the first dielectric layer 15. In a further embodiment, the upper surface of the Cu metal studs 20 is recessed from about 20 nm to about 50 nm from the upper surface 15a of the first dielectric layer 15.

In one embodiment, recessing the metal stud 20 below the upper surface 15a of the first dielectric layer 15 exposes the sidewalls of the electrically conductive liner 35 disposed on the via 10 sidewalls, hence providing a cavity in the upper portion of the via 10. Following etch recess the upper surface of the metal stud 20, the protective photomask 50 removed using a chemical strip.

Figure 3:
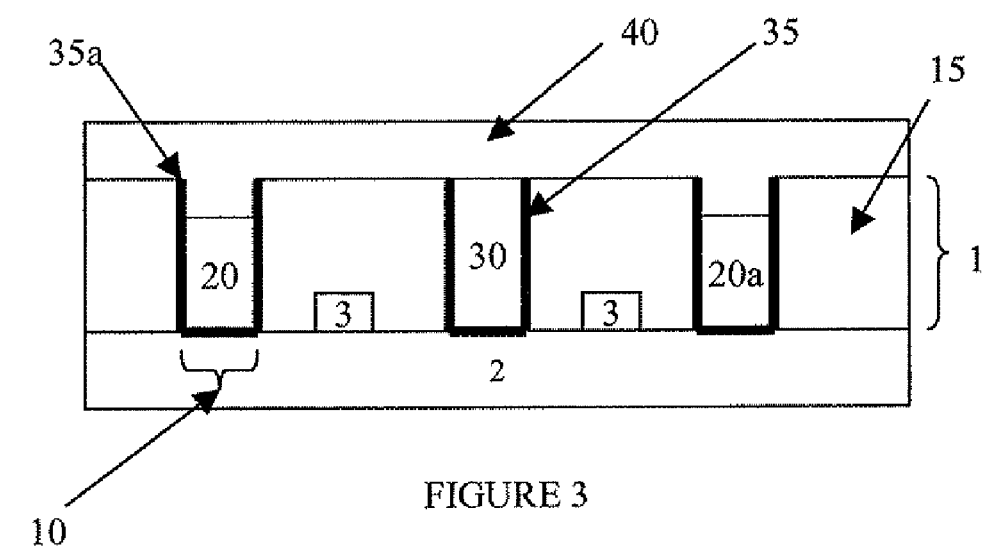
FIG. 3 is a side cross sectional view depicting forming a second dielectric layer atop the recessed metal stud, in accordance with at least one embodiment of the present invention.

FIG. 3 is a side cross sectional view depicting the formation of a second dielectric layer 40 atop the recessed metal stud 20a, the electrically conductive liner 35 and the first dielectric layer 15, in accordance with the present invention. In one embodiment, the second dielectric layer 40 is deposited atop the recessed metal stud 20a filling the cavity formed in the upper portion of the via 10. Similar to the first dielectric layer 15, the second dielectric layer 40 includes any suitable insulating material that is typically employed in interconnects to electrical devices. The second dielectric layer 40 may comprise the same or a different dielectric from the first dielectric layer 15. In one embodiment, the second dielectric layer 40 may be composed of high density plasma (HDP) PECVD silicon oxide having a thickness ranging from about 10 nm to about 300 nm. In one embodiment, the dielectric constant of the second dielectric layer 40 may range from about 2 to about 100, In one embodiment, the second dielectric layer 40 is formed by a deposition process including, for example, chemical vapor deposition (CVD), plasma-assisted CVD, evaporation, spin-on coating, or chemical solution deposition.

Figure 4A:
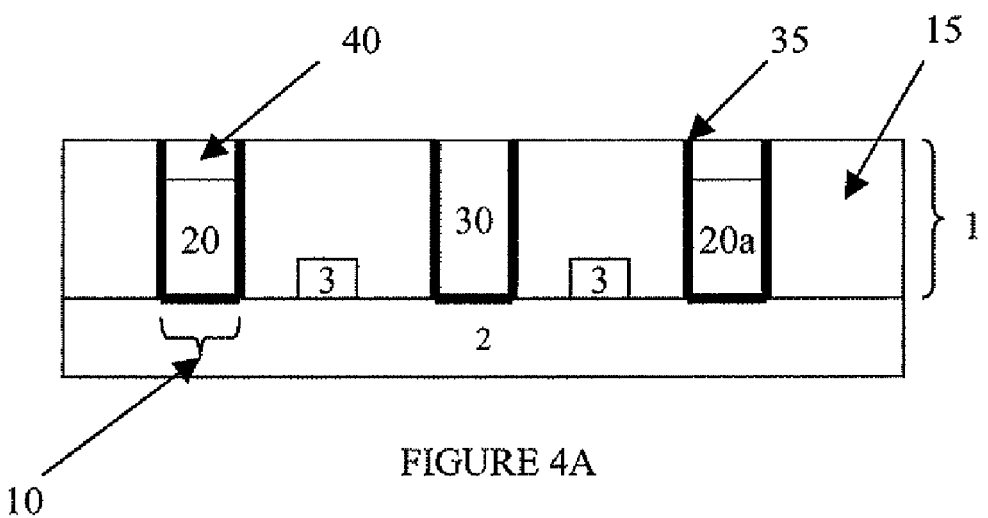
FIG. 4A is a side cross sectional view depicting one embodiment of a planarization step to expose an upper surface of the electrically conductive liner, in accordance with the present invention.
Figure 4B:
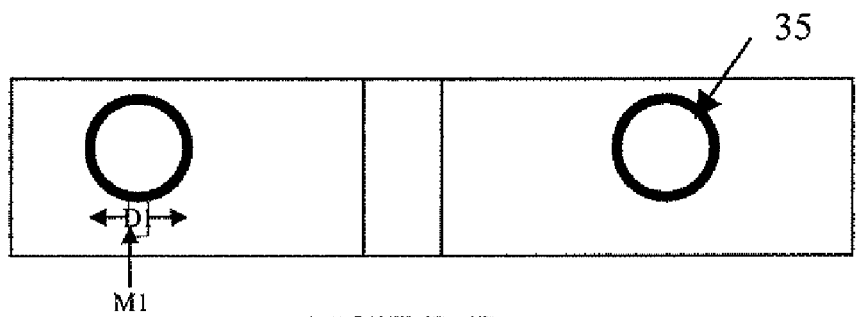
FIG. 4B is a top planar view of the structure depicted in FIG. 4A.

FIGS. 4A and 4B depict one embodiment of a planarization process to expose an upper surface 35a of the electrically conductive liner 35, in accordance with the present invention. In one embodiment, the planarization process includes chemical mechanical planarization (CMP). The planarization process is continued until an upper surface 35a of the electrically conductive liner 35 is exposed. In one embodiment, the exposed upper surface 35a of the electrically conductive liner 35 provides electrical contact to a formed memory cell. FIG. 4B is a top planar view depicting the ring orientation of one embodiment of an electrode formed using the inventive method. As depicted in FIG. 4B, the electrical contact is provided by the upper exposed surface 35a of the electrically conductive liner 35, wherein a ring geometry is defined by the perimeter of the exposed surface 35a of the electrically conductive liner 35.

Following the formation of the electrode, a memory device for non-volatile or volatile memory may be provided in electrical contact to the exposed surface of the electrically conductive liner 35, wherein the memory device may include a resistive memory or phase change memory element.

Figure 5:
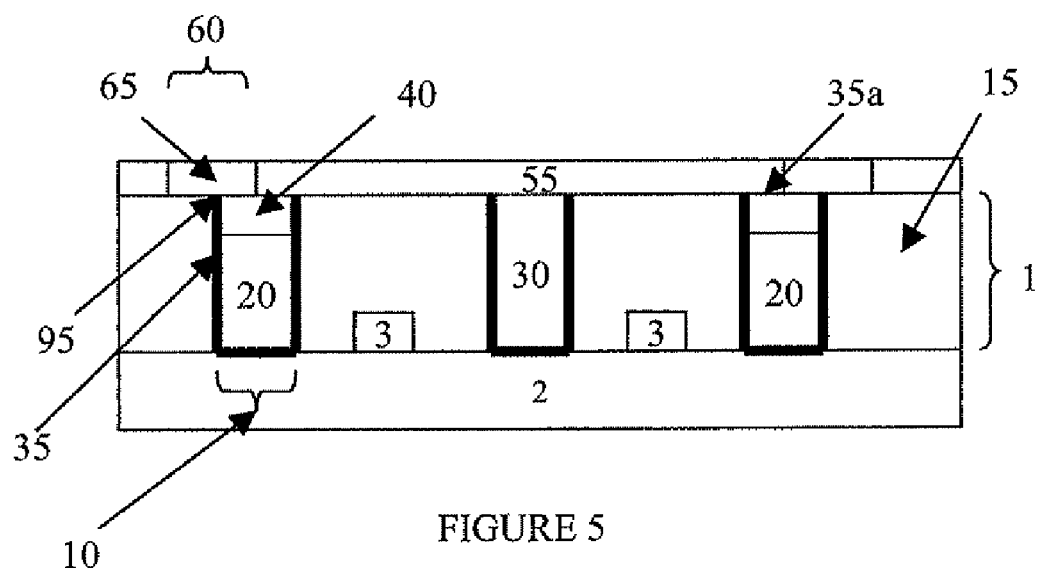
FIGS. 5-7 are side cross sectional views depicting a process flow for forming a phase change material memory cell in electrical contact with the exposed upper surface of the electrically conductive liner, in accordance with one embodiment the present invention.
Figure 6:
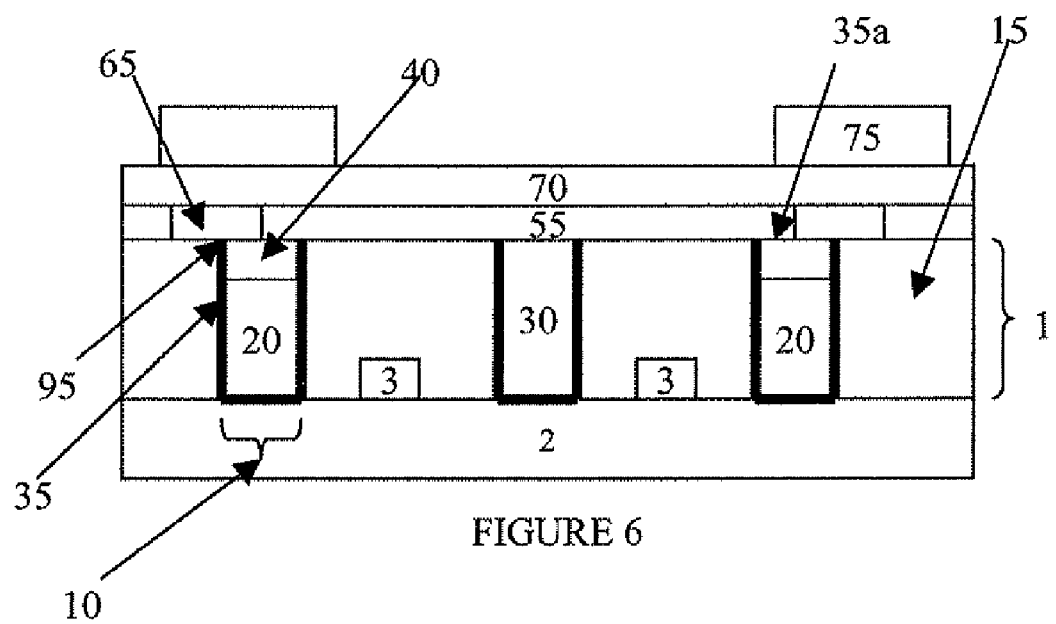
Figure 7:
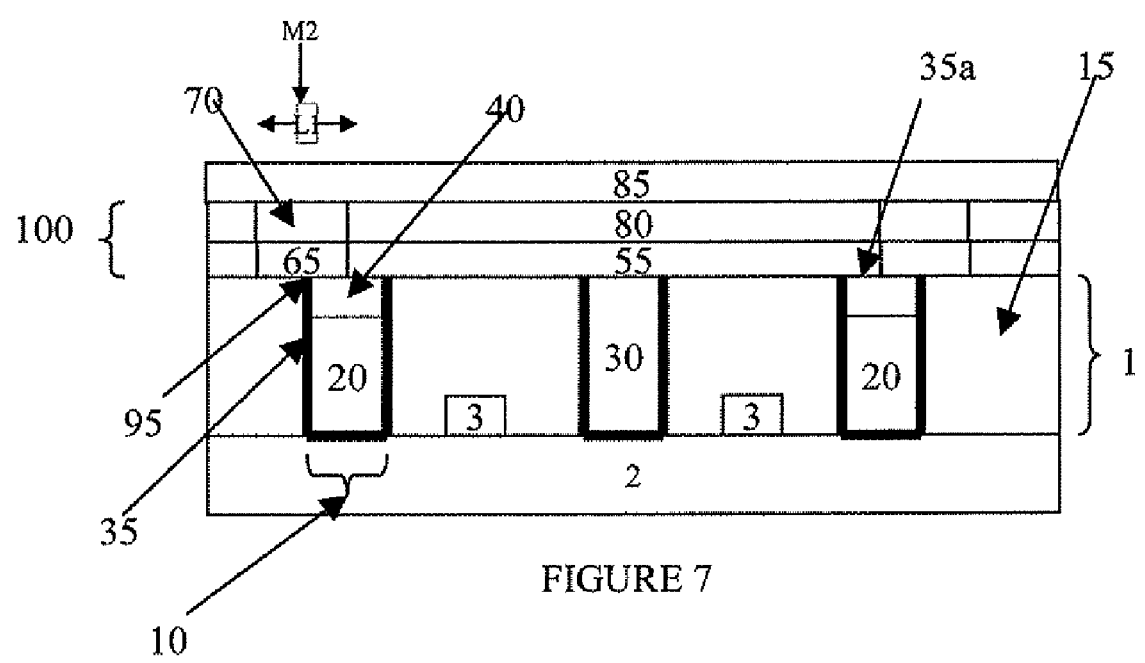

FIGS. 5-7 depict one embodiment of forming a phase change material memory cell 100 in electrical contact with the exposed upper surface of the electrically conductive liner 35.

Referring to FIG. 5, in one embodiment, forming the phase change-memory cell 100 includes depositing a third dielectric layer 55 atop the upper surface of first dielectric layer 15, upper surface of the electrically conductive liner 35 and second dielectric layer 40; patterning and etching the third dielectric layer 55 to provide openings 60 exposing a portion of the upper surface 35a of the electrically conductive liner 35; and then depositing a phase change material 65 at least filling the openings 60. In one embodiment, the thickness of the phase change material 65 may range from about 10 nm to about 400 nm. In one embodiment, deposition of the phase change material may include blanket deposition of the phase change material 65 followed by planarization to provide an upper surface of the phase change material 65 being substantially coplanar with the upper surface of the third dielectric layer 55.

In one embodiment, the phase change material 65 may be switched from an amorphous phase to a crystalline phase. When in an amorphous state, the phase change material 65 exhibits a high resistivity, typically ranging from about $10^2$ ohm-m to about $10^4$ ohm-m. When in a crystalline state, the phase change material 65 is more conductive, exhibiting a lower resistivity typically ranging from about $10^{-5}$ ohm-m to about $10^{-2}$ ohm-m. In one embodiment, the phase change material 65 may comprise chalcogenide alloys. The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si. In other embodiments, the phase change material is made of any suitable material including one or more of the elements Te, Ga, In, Se, and S. In one embodiment, the phase change material liner has a composition of $Ge_2Sb_2Te_5$ (GST). Although chalcogenides are a group of materials commonly utilized as phase change material, some phase change materials, such as GeSb, do not utilize, chalcogenides. Thus, a variety of materials can be used in a phase change material cell as long as they can retain separate amorphous and crystalline states of distinct resistivity.

In one embodiment, a phase change material 65 composed of GST when at a temperature of about 25° C. is in an amorphous phase. As the temperature of the GST phase change material is increased to about 125° C. to about 150° C., the resistivity of the phase change material decreases representing the transition temperature for a phase change from an amorphous phase to Face Center Cubic (FCC) phase. Further increases in the temperature of the GST phase change material to greater than about 180° C. result in further decreases in resistivity, which result from a phase change from the Face Centered Cubic (FCC) phase to a Hexagonal (Hex) phase of the GST. When the temperature of the GST phase change material is increased above the melting temperature (approximately 620° C.), the GST phase change material melts and upon quench returns to the amorphous solid phase. Quench denotes solidification in a time period on the order of about 0.5 to about 50 nanoseconds.

Referring to FIG. 6, in one embodiment of the present invention, a barrier metal 70 is formed atop the phase change material 65. In one embodiment the barrier metal 70 is TiN, TaN or a combination thereof In one embodiment, the barrier metal 70 is blanket deposited by a physical deposition process, such as sputtering. In another embodiment, the barrier metal 70 may be deposited by chemical vapor deposition. In one embodiment, the layer of barrier metal 70 may have a thickness ranging from about 20 nm to about 200 nm. Following deposition, the barrier metal 70 is patterned and etched to correspond to the phase change material 65.

In one embodiment, a fourth dielectric is deposited and planarized to provide a fourth dielectric layer 80 having an upper surface substantially coplanar to an exposed upper surface of the barrier metal 70. Following planarization to expose the barrier metal, an upper conductive line 85 is formed in electrical contact to the barrier metal 70, as depicted in FIG. 7.

In one embodiment, the conductive line 85 is word line orbit line. In one embodiment, the conductive line 85 is a metal. Examples of metals used to provide the upper conductive line 85 may include Cu, Ti, Ta, W, Al, Pd, Pt, Ag, Au or alloys and combinations thereof.

Figure 8:
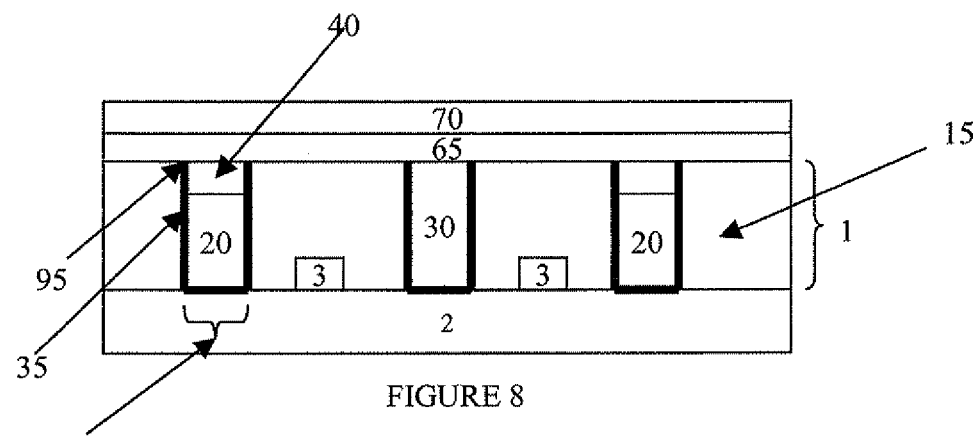
FIGS. 8-10 are side cross sectional views depicting forming a phase change material memory cell in electrical contact with the exposed upper surface of the electrically conductive liner, in accordance with another embodiment of the present invention.
Figure 9:
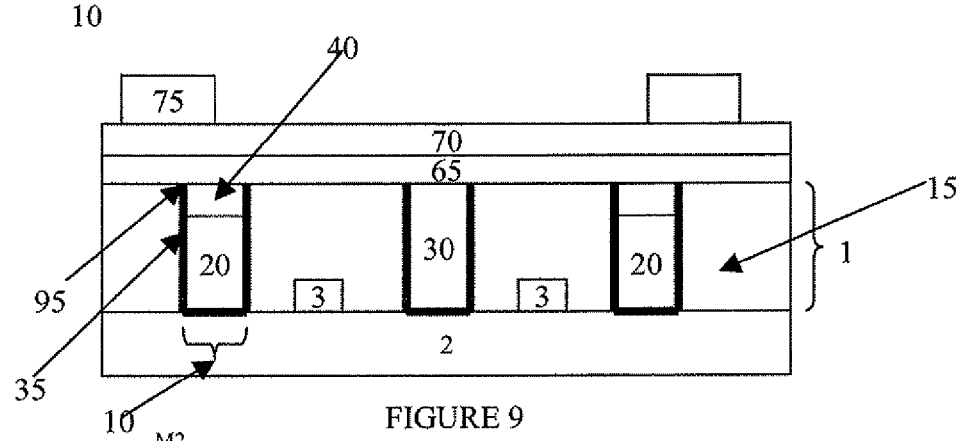
Figure 10:
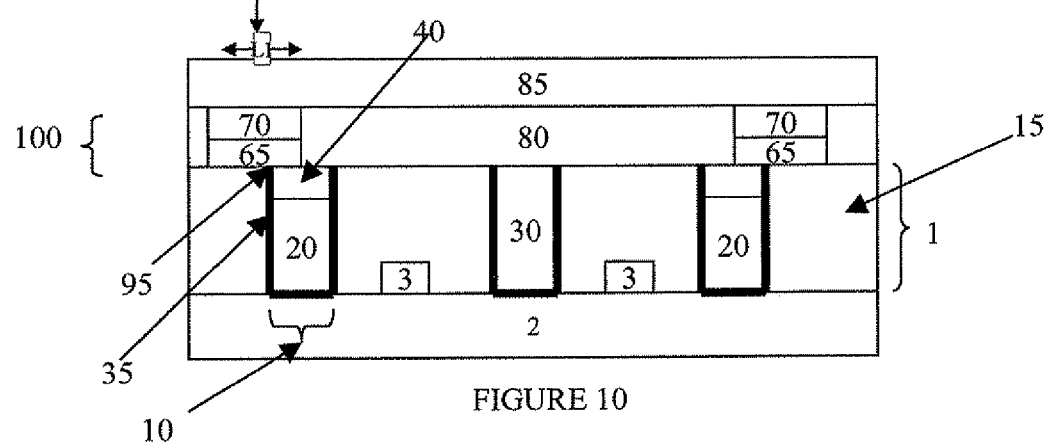

FIGS. 8-10 depict another embodiment of a method for forming a memory cell 100 in electrical contact with the above-described electrode. In one embodiment, the phase change material 65 may be blanket deposited atop the upper surface of the structure depicted in FIGS. 4A and 4B by a chemical vapor deposition process. Thereafter, a layer of barrier metal 70 is deposited atop the phase change material 65, as depicted in FIG. 8.

In a following process step, a barrier metal/phase change material stack is provided by applying a photolithography and etch process, as depicted in FIG. 9. More specifically, in one embodiment, a pattern is produced by applying a photoresist 75 to the layer of barrier metal; exposing the photoresist 75 to a pattern of radiation selected to provide at least one barrier metal/phase change material stack; and then developing the pattern into the photoresist 75 utilizing resist developer. Once the patterning of the photoresist 75 is completed, the sections covered by the photoresist 75 are protected, while the exposed regions are removed using a selective etching process that removes the unprotected regions, wherein the resulting barrier metal/phase change material stack is in electrical contact with the upper surface of the electrically conductive liner 35

Referring to FIG. 10, in one embodiment, in a following process step an isolation dielectric 80 is blanket deposited and planarized to expose at least an upper surface of the barrier metal/phase change material stack. Thereafter, an upper conductive line 85 is formed in electrical contact to the barrier metal 70, wherein the upper conductive line 85 may be a word line or bit line.

Referring to FIGS. 7 and 10, and in one embodiment, at least the phase change material 65 of the memory cell 100 is offset from the electrically conductive liner 35. The term "offset" means that the center of the phase change material 65 is offset from the center of the via 10, wherein the electrically conductive liner 35 is formed on the via sidewalls. In one embodiment, the center of the via 10 is the midpoint $M_1$ of the diameter $D_1$ of a circular electrically conductive liner 35, also referred to as ring electrode, when viewed from a top plan view, as depicted in FIG. 4B. In embodiments of the invention in which the electrically conductive liner 35 does not have a circular geometry, the center of the via 10 is the midpoint of the dimension defining the separation of opposing sidewalls of the via 10. The center of the phase change material 65 means the midpoint $M_2$ of the greatest dimension $L_1$ defining the phase change material 65 that is parallel to the plane defined by the upper surface of the phase change material 65. In one embodiment, by providing a memory cell 100 in which the phase change material 65 is offset and in electrical contact with only a portion the electrically conductive liner 35, the surface area of the electrical contact 95 between the two structures is reduced in comparison to when the entire upper surface of the electrically conductive liner 35 is in electrical contact with the phase change material 65 of the memory cell 100.

In one embodiment, the phase change material 65 is in electrical contact with about ¼ to about ¾ of the upper surface of electrically conductive liner 35. In another embodiment, the phase change material 65 is in electrical contact with less than ½ the upper surface of the electrically conductive liner 35. In one embodiment, the surface area of the direct physical contact 95 of the phase change material 65 and the upper surface of the electrically conductive liner 35 may range from about 100 $nm^2$ to about 10000 $nm^2$. In another embodiment, the surface area of the direct physical contact 95 of the phase change material 65 and the upper surface of the electrically conductive liner 35 may range from about 100 $nm^2$ to about 1000 $nm^2$.

While the present invention has been particularly shown and described with respect to the preferred embodiments thereof, it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed is:

1. A method of manufacturing a memory device comprising:
   providing at least one metal stud positioned in a first via extending into a first dielectric layer, wherein an electrically conductive liner is positioned between at least a sidewall of the first via and the at least one metal stud;
   etching the at least one metal stud selective to the electrically conductive liner to provide at least one recessed metal stud, wherein the electrically conductive liner extends along an entire length of sidewalls of the at least one recessed metal stud;

forming a second dielectric layer atop the at least one recessed metal stud and filling the first via, the second dielectric layer having an upper surface that is coplanar with an upper surface of the first dielectric layer and an upper surface of the electrically conductive liner, wherein the upper surface of the electrically conductive liner is exposed;

forming a phase change memory cell within a second via of a third dielectric layer that is present atop the second dielectric layer, wherein the phase change memory cell is in contact with the upper surface of the electrically conductive liner; and forming a barrier metal layer atop the phase change material cell, wherein the barrier metal layer is also present in the second via, wherein sidewalls of the barrier metal layer are aligned with sidewalls of the phase change material cell.

2. The method of claim 1, wherein the at least one metal stud comprises W and the electrically conductive liner comprises TiN.

3. The method of claim 1, wherein the first dielectric layer comprises a boron phospho silicate glass (BPSG) oxide and the second dielectric layer comprises an oxide.

4. The method of claim 1, wherein an upper surface of the at least one recessed metal stud is from about 10 nm to about 50 nm from the upper surface of the first dielectric layer.

5. The method of claim 1, wherein the first dielectric layer has a thickness ranging from 50 nm to about 500 nm and the second dielectric layer has a thickness ranging from about 20 nm to about 300 nm.

6. The method of claim 1, wherein the second dielectric layer is deposited by chemical vapor deposition.

7. The method of claim 2, wherein the etching of the at least one metal stud selective to the electrically conductive liner is a reactive ion etch comprising a sulfur hexafluoride/oxygen inductively coupled plasma having a density greater than about $10^{10}$ cm$^{-3}$.

8. The method of claim 1, wherein the phase change material comprises Ge, Sb, Te or a combination thereof.

9. The method of claim 1, wherein the deposition of the phase change material comprises chemical vapor deposition.

10. The method of claim 1, wherein the barrier metal layer atop the phase change material comprises TiN.

* * * * *